(12) United States Patent
Ono

(10) Patent No.: US 9,985,254 B2
(45) Date of Patent: May 29, 2018

(54) MANUFACTURING METHOD OF ELECTRODE AND DISPLAY DEVICE INCLUDING THE ELECTRODE

(71) Applicant: Japan Display Inc., Tokyo (JP)

(72) Inventor: Keisuke Ono, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days. days.

(21) Appl. No.: 15/351,712

(22) Filed: Nov. 15, 2016

(65) Prior Publication Data

US 2017/0200922 A1 Jul. 13, 2017

(30) Foreign Application Priority Data

Jan. 7, 2016 (JP) .................... 2016-001474

(51) Int. Cl.
| | | |
|---|---|---|
| *H01L 51/52* | (2006.01) | |
| *H01L 51/56* | (2006.01) | |
| *C23C 14/04* | (2006.01) | |
| *C23C 14/08* | (2006.01) | |
| *C23C 14/35* | (2006.01) | |
| *C23C 14/50* | (2006.01) | |
| *H01L 51/00* | (2006.01) | |
| *H01L 27/32* | (2006.01) | |

(52) U.S. Cl.
CPC ............. *H01L 51/56* (2013.01); *C23C 14/04* (2013.01); *C23C 14/044* (2013.01); *C23C 14/086* (2013.01); *C23C 14/35* (2013.01); *C23C 14/50* (2013.01); *H01L 51/0021* (2013.01); *H01L 51/5253* (2013.01); *H01L 27/3244* (2013.01); *H01L 51/5203* (2013.01); *H01L 51/5234* (2013.01); *H01L 2227/323* (2013.01); *H01L 2251/305* (2013.01); *H01L 2251/558* (2013.01)

(58) Field of Classification Search
CPC .......... H01L 27/3244; H01L 51/00021; H01L 51/5253; H01L 51/5234; H01L 2227/323; H01L 2251/305; H01L 2251/558; H01L 51/0021; C23C 14/04
USPC .................................. 438/34, 104, 181, 609
See application file for complete search history.

(56) References Cited

U.S. PATENT DOCUMENTS

| | | | | |
|---|---|---|---|---|
| 5,421,908 A | * | 6/1995 | Yoshida | .......... H01L 31/022425 136/244 |
| 6,201,346 B1 | * | 3/2001 | Kusaka | ............... H01L 27/3288 313/504 |
| 7,902,743 B2 | | 3/2011 | Nakayama | |

(Continued)

FOREIGN PATENT DOCUMENTS

| | | | | | |
|---|---|---|---|---|---|
| CA | 2908205 | * | 1/2006 | ............. | C23C 14/34 |
| JP | 11126691 A | * | 5/1999 | ............. | H05B 33/26 |

(Continued)

*Primary Examiner* — Johannes P Mondt
(74) *Attorney, Agent, or Firm* — Typha IP LLC

(57) ABSTRACT

A manufacturing method of a display device is provided. The manufacturing method includes: forming a first electrode over a substrate; forming an organic layer over the first electrode; and forming a second electrode over the organic layer by sputtering a target including a conductive oxide with a light-transmitting property. A mask is arranged between the organic layer and the target when the second electrode is formed. The mask has periodically arranged through holes with a maximum width equal to or larger than 0.1 μm and equal to or smaller than 3 μm.

18 Claims, 11 Drawing Sheets

(56) References Cited

U.S. PATENT DOCUMENTS

2011/0101855 A1* 5/2011 Mizuno .............. H01L 27/3211
  313/504
2016/0231468 A1* 8/2016 Ootsuka .............. G02B 3/0018

FOREIGN PATENT DOCUMENTS

JP     2008-84541 A       4/2008
WO    WO-2015045914 A1 *  4/2015   ............ H01L 27/14

* cited by examiner

MANUFACTURING METHOD OF ELECTRODE AND DISPLAY DEVICE INCLUDING THE ELECTRODE

CROSS REFERENCE TO RELATED APPLICATIONS

This application is based on and claims the benefit of priority from the prior Japanese Patent Application No. 2016-001474, filed on Jan. 7, 2016, the entire contents of which are incorporated herein by reference.

FIELD

The present invention relates to a manufacturing method of an electrode and a display device having the electrode formed by the manufacturing method. For example, the present invention relates to a manufacturing method of an electrode including a conductive oxide having a light-transmitting property and a display device having the electrode formed by the manufacturing method.

BACKGROUND

A liquid crystal display device and an EL (electroluminescence) display device which respectively have a liquid crystal element and a light-emitting element in each pixel are represented as a typical example of a display device. These display devices have display elements such as a liquid crystal element or an organic light-emitting element in each of the plurality of pixels formed over a substrate. A liquid crystal element and a light-emitting element have a pair of electrodes, and at least one of the pair of electrodes transmits visible light. For example, a light-emitting element has a structure in which a layer (hereinafter, referred to as an organic layer) including a light-emissive organic compound is sandwiched between a pair of electrodes and is designed so that at least one of the pair of electrodes transmits visible light.

As a typical material of an electrode which transmits visible light (hereinafter, referred to as a light-transmitting electrode), indium-tin-oxide (ITO) and indium-zinc-oxide (IZO) are represented. Japanese patent application publication No. 2008-84541 discloses an EL display device using an ITO film or IZO film formed by a sputtering method as a light-transmitting electrode

SUMMARY

An embodiment of the present invention is a manufacturing method of a display device. The manufacturing method includes: forming a first electrode over a substrate; forming an organic layer over the first electrode; and forming a second electrode over the organic layer by sputtering a target including a conductive oxide with a light-transmitting property. A mask is arranged between the organic layer and the target when the second electrode is formed. The mask has periodically arranged through holes having a maximum width equal to or larger than 0.1 μm and equal to or smaller than 3 μm.

An embodiment of the present invention is a manufacturing method of a display device. The manufacturing method includes: forming a first electrode over a substrate; forming an organic layer over the first electrode; disposing, over the organic layer, a mask having periodically arranged through holes; and forming a second electrode over the organic layer by sputtering a target including a conductive oxide with a light-transmitting property. A maximum area of the through holes is smaller than an area where the organic layer and the first electrode contact with each other.

An embodiment of the present invention is a film-forming apparatus including: a chamber; a holder located in the chamber and configured to hold a target; a stage located in the chamber and under the holder and configured to support a substrate; a power source configured to induce an electric discharge in the chamber; a gas-supplying portion configured to supply a gas to the chamber; and a mask holder configured to hold a mask having a plurality of periodically arranged through holes, the mask being arranged between the substrate and the target.

DESCRIPTION OF EMBODIMENTS

Hereinafter, the embodiments of the present invention are explained with reference to the drawings. However, the invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

First Embodiment

In the present embodiment, a manufacturing method of a display device according to an embodiment of the present invention is explained with reference to FIG. 1 to FIG. 6B. In the present embodiment, a manufacturing method of a light-emitting element included in the display device is explained as an example.

1. Sputtering Apparatus

Figure 1:
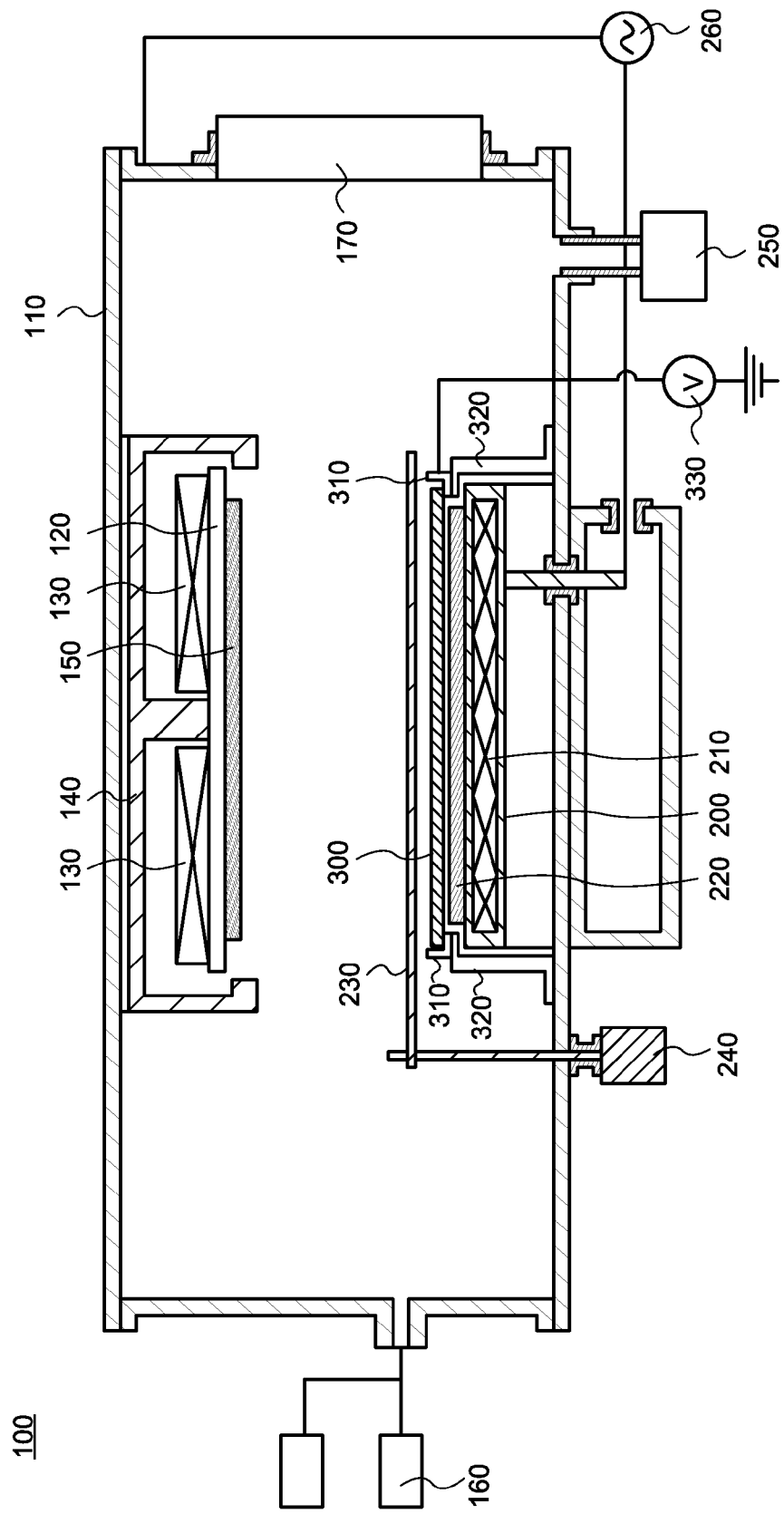
FIG. 1 is a schematic cross-sectional view of an apparatus for manufacturing a display device according to an embodiment.

As described below, the light-emitting element has at least one light-transmitting electrode. A schematic cross-sectional view of a sputtering apparatus 100 for depositing the light-transmitting electrode is shown in FIG. 1.

The sputtering apparatus 100 has a stage 200 in a lower part of a chamber 110 over which a substrate 220 is arranged and supported. The stage 200 is equipped with a temperature-controlling portion 210 for controlling a substrate temperature, by which a temperature of the substrate 220 can be freely controlled.

A holder 120 for holding a target 150 is provided in an upper part of the chamber 110, and a temperature of the holder 120 is controlled with a temperature-controlling portion 130. The temperature-controlling portion 130 allows a temperature of the target 150 to be controlled during the film formation. Magnets 140 for generating a magnetic field parallel to a surface of the target 150 are arranged over and beside the holder 120. The installation of the magnets 140 is optional. The magnets 140 may be disposed only over the target 150. A distance between the target 150 and the substrate 220 can be freely set and is preferably equal to or larger than 5 cm and equal to or smaller than 20 cm. The positional relationship of the holder 120 and the stage 200 may be reversed so that the target 150 and the substrate 220 are located in the lower part and the upper part of the chamber 110, respectively. In this case, the substrate 220 is arranged in the chamber 110 so that its treatment surface faces downward.

A sidewall of the chamber 110 is equipped with a gate valve 170 which is used when the substrate 220 is transported into and from the chamber 110. A robot arm (not shown) or the like can be used to transport the substrate 220. A gas-supplying portion 160 is further provided to the chamber 110, and the gas-supplying portion 160 can be used to introduce a variety of gases including an inert gas such as argon and nitrogen, oxygen, and the like. An exhaust apparatus 250 is connected to the chamber 110 and used to reduce pressure in the chamber 110.

An alternating power source 260 is further provided to the sputtering apparatus 110. As the alternating power source 260, a high-frequency power source of 13.56 MHz can be used, for example. The formation of an electrical field between the target 150 and the substrate 220 with the alternating power source 260 induces a grow discharge around the target 150. The gas molecules or atoms introduced into the chamber 110 with the gas-supplying portion 160 are ionized with the grow discharge to generate plasma. The ions are accelerated with a voltage applied with the alternating power source 260 and collided with the target 150. A target material in the target 150 is sputtered by the collision of the ions with the target 150 and deposited through which the film formation takes place over the substrate 220. On/off of the film formation can also be controlled with a shutter 230, and the shutter 230 is opened and closed with a shutter-controlling portion 240.

The sputtering apparatus 100 further possesses a mask holder 310 over the stage 200, and the mask holder 310 can hold a mask 300 between the substrate 220 and the target 150. An alignment mechanism 320 is installed to the mask holder 310, by which the mask 300 can be moved three-dimensionally (in a plane parallel to the substrate 220 and in a direction along a normal line of the substrate 220). With this structure, the position of the mask 300 with respect to the substrate 220 can be adjusted. By using the alignment mechanism 320, a distance between the mask 300 and the substrate 220 is adjusted to be 0.5 mm to 20 mm or preferably 1 mm to 10 mm so that the mask 300 does not contact with the substrate 220. A power source 330 is connected to the mask holder 310, by which a direct voltage or an alternating voltage can be applied on the mask holder 310 and the mask 300.

2. Manufacturing Method of Light-Emitting Element

Figure 2A:
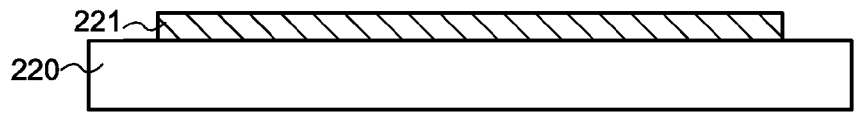
FIG. 2A to FIG. 2D are each a schematic view showing a manufacturing method of a display device according to an embodiment.

Next, a manufacturing method of the light-emitting element is explained with reference to FIG. 2A to FIG. 8B. As shown in FIG. 2A, a first electrode 221 is formed over the substrate 220. The substrate 220 is configured to provide physical strength to the light-emitting element and can be a substrate which is resistant to the environments in the following manufacturing process. Specifically, quartz, glass, plastic, a metal, and the like can be used. The substrate 220 may have flexibility.

The first electrode 221 has a function to inject charges into an organic layer 222 formed later. When the light emission from the organic layer 222 is extracted from a side of the substrate 220, a material having a light-transmitting property, such as a conductive oxide represented by ITO and IZO, can be used, for example. When the light emission from the organic layer 222 is extracted from a side opposite to the substrate 220, the first electrode 221 may be configured to reflect visible light, and a metal such as silver, magnesium, and aluminum can be used. Alternatively, a light-transmitting conductive oxide may be stacked over a metal. The first electrode 221 can be formed with a sputtering method, an evaporation method, a sol-gel method, a printing method, and the like. Note that the case of using a sputtering method is explained below in detail.

Figure 2B:
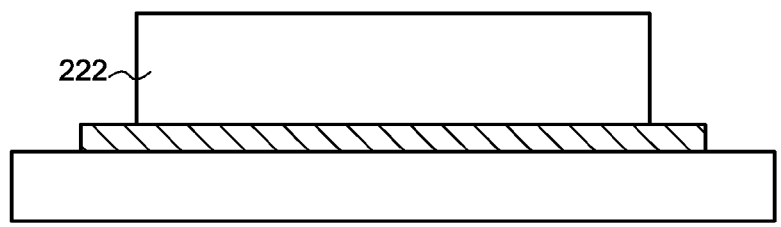

The organic layer 222 is formed over the first electrode 221 (FIG. 2B). In FIG. 2B, the organic layer 222 is illustrated so as to have a single layer structure. However, a plurality of layers having a variety of functions can be stacked. For example, a charge-injection layer, a charge-transporting layer, a charge-blocking layer, an emission layer, and the like can be used in appropriate. The organic layer 222 can be formed with an evaporation method, an ink-jet method, a spin-coating method, and the like.

Figure 2C:
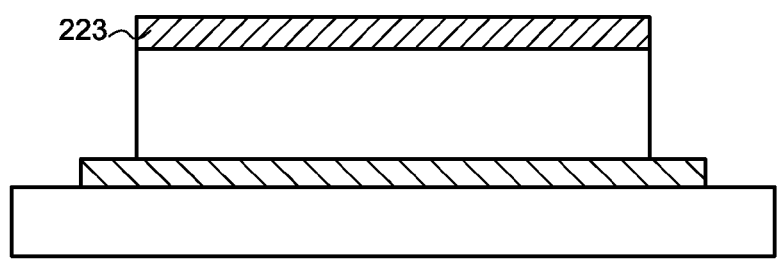

A second electrode 223 is formed over the organic layer 222 (FIG. 2C). The second electrode 223 has a function to inject charges to the organic layer 222. When the light emission from the organic layer 222 is extracted from the side opposite to the substrate 220, a material having a light-transmitting property, such as a conductive oxide represented by ITO and IZO, can be used, for example. When the light emission from the organic layer 222 is extracted from the side of the substrate 220, the first electrode 221 may be configured to reflect visible light, and a metal such as silver, magnesium, and aluminum can be used. The second electrode 223 can be formed with a sputtering method, an evaporation method, a sol-gel method, a printing method, and the like.

When one or both of the first electrode 221 and the second electrode 223 are formed with a sputtering method, the sputtering apparatus 100 shown in FIG. 1 can be used. Specifically, the substrate 220 is fixed over the stage 200 before forming the first substrate 221 or after forming the organic layer 222. After the pressure in the chamber 110 is reduced to approximately $10^{-3}$ Pa, an inert gas such as argon is introduced so that the pressure of the chamber 110 becomes approximately 1 Pa to 10 Pa, and an alternating voltage of several kV is applied between the target 150 and the stage 200. The grow discharge is generated, and the inert gas is ionized, accelerated, and collided with the target 150.

As the target 150, a conductive oxide such as ITO and IZO may be used. The ions of the accelerated gas are collided with the target 150 and sputter the material included in the target 150, and the sputtered material is deposited over the substrate 220 or the organic layer 220, resulting in the formation of the first electrode 221 and the second electrode 223.

Figure 4A:
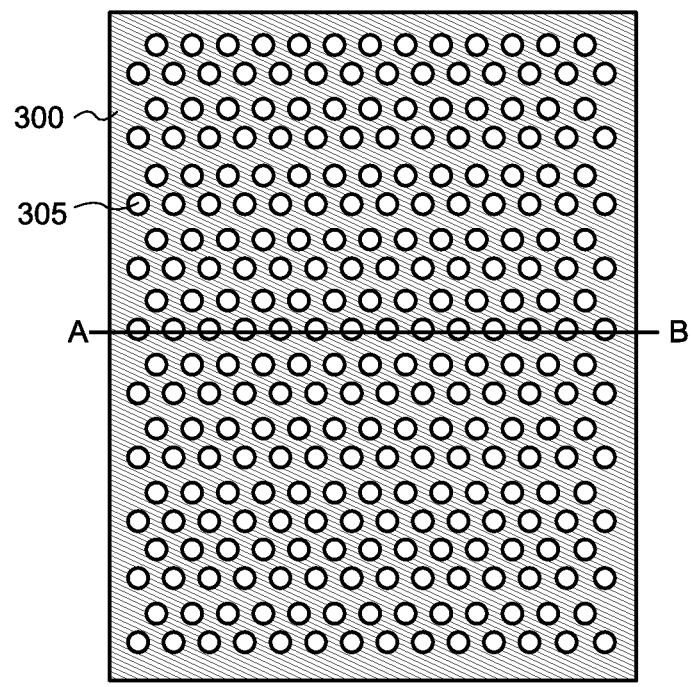
FIG. 4A and FIG. 4B are a top view and a cross-sectional view of a mask used in fabrication of a display device according to an embodiment, respectively.
Figure 4B:
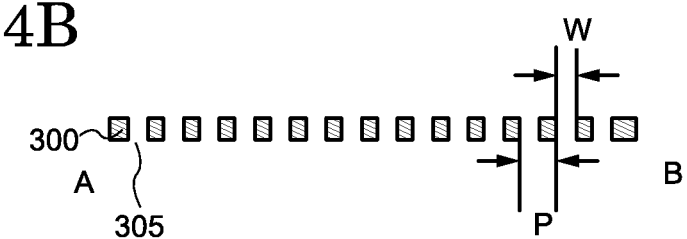

At this time, the mask 300 shown in FIGS. 4A and 4B is arranged on the mask holder 310 so as to cover the substrate 220 or the organic layer 222. The position of the mask 300 is adjusted by using the alignment mechanism 320 so that the mask 300 and the substrate 220 do not contact with each other and that the distance therebetween is 0.5 mm to 20 mm or preferably 1 mm to 10 mm. The mask 300 can be formed by using a metal such as stainless steel, nickel, and chromium.

Figure 2D:
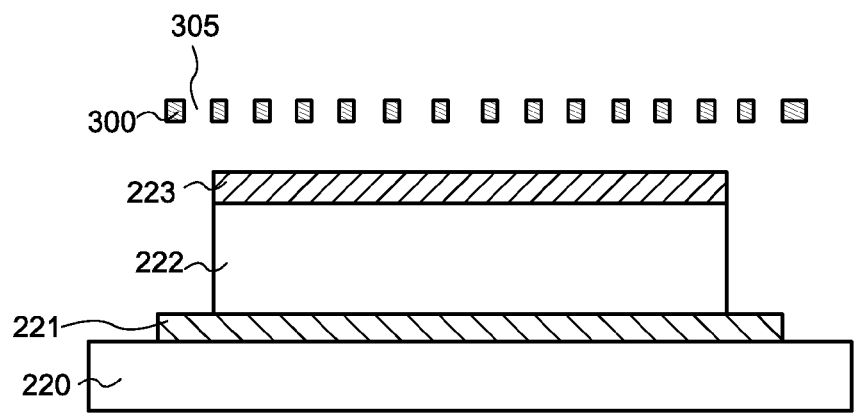

FIG. 4B is a cross-sectional view along straight line A-B of FIG. 4A (hereinafter, the same is applied to FIG. 5A to FIG. 7B). As shown in FIGS. 4A and 4B, a plurality of through holes 305 is periodically provided to the mask 300. The size of the through holes 305 is larger than that of the first electrode 221 and the second electrode 223 of the light-emitting element. Specifically, a width W of the largest through hole 305 among the plurality of through holes 305 (hereinafter, referred to as a maximum width of the through holes 305) is 0.1 μm to 3 μm or preferably 1 μm to 3 μm. It is preferred that a distance between two adjacent through holes 305 be the same or close to W. Therefore, a pitch P of the through holes 305 is 0.2 μm to 6 μm or preferably 2 μm to 6 μm. Hence, as shown in FIG. 2D, when the first electrode 221 and the second electrode 223 are formed, the plurality of through holes 305 overlaps one first electrode 221 and further overlaps with a region (emission region) where the first electrode 221 and the organic layer 222 are in contact with each other. Additionally, an area of the largest through hole 305 among the plurality of through holes 305 (hereinafter, referred to a maximum area of the through holes 305) is smaller than a region where the first electrode 221 is in contact with the organic layer 222.

Figure 5A:
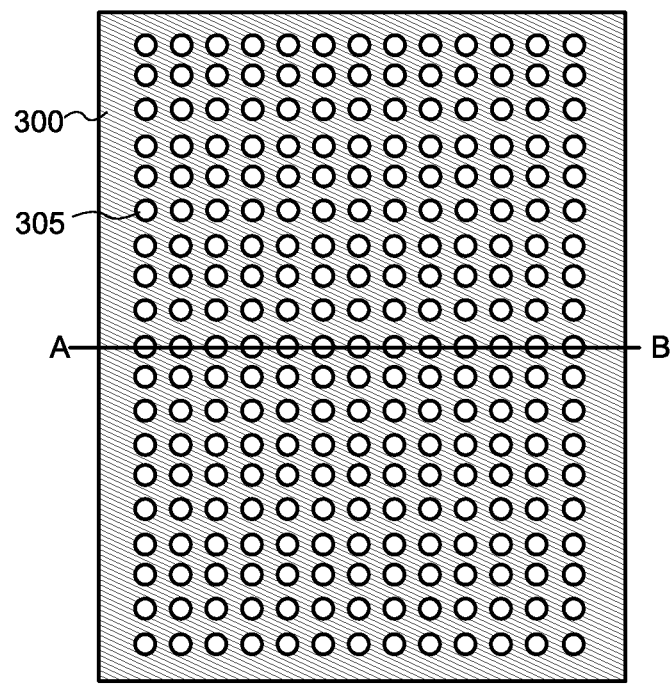
FIG. 5A and FIG. 5B are a top view and a cross-sectional view of a mask used in fabrication of a display device according to an embodiment, respectively.
Figure 5B:
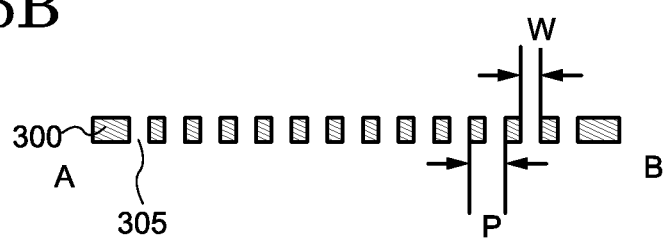

The through holes 305 of the mask 300 shown in FIG. 4A are arranged so as to be located at vertexes of hexagons and form a honeycomb pattern. However, the arrangement pattern is not limited thereto in the present embodiment, and the through holes 305 may be arranged in a matrix form as shown in FIG. 5A, for example. In this case, as shown in FIG. 5B, the maximum width W of the through holes 305 is also 0.1 μm to 3 μm or preferably 1 μm to 3 μm, and the pitch P is also 0.2 μm to 6 μm or preferably 2 μm to 6 μm.

Figure 6A:
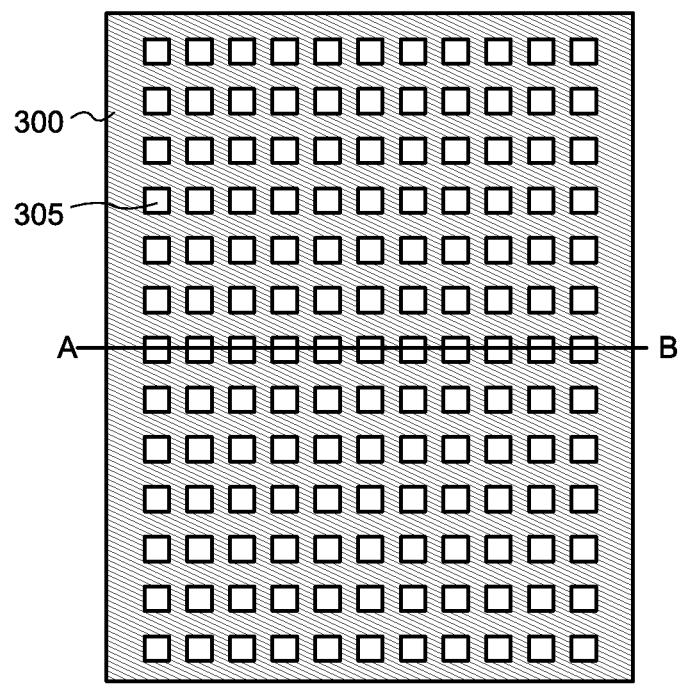
FIG. 6A and FIG. 6B are a top view and a cross-sectional view of a mask used in fabrication of a display device according to an embodiment, respectively.
Figure 6B:
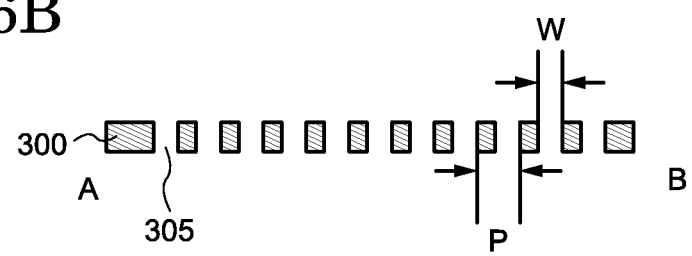
Figure 7A:
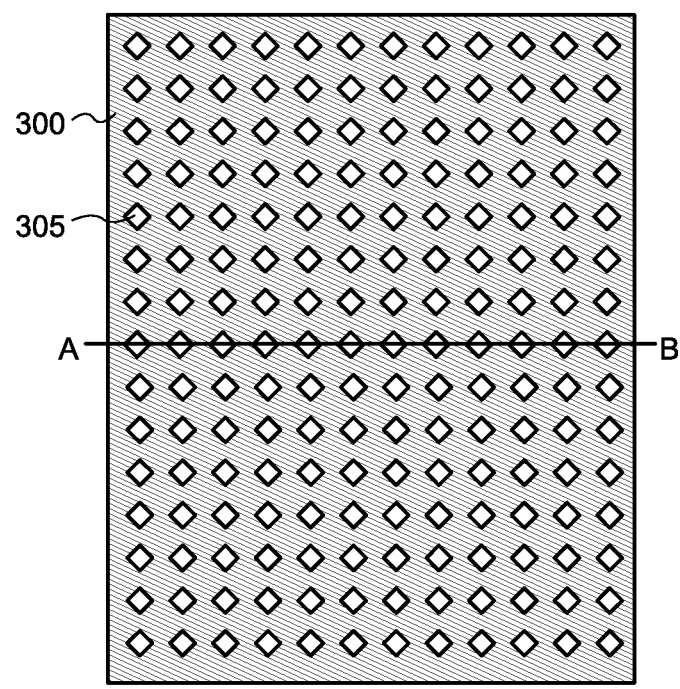
FIG. 7A and FIG. 7B are a top view and a cross-sectional view of a mask used in fabrication of a display device according to an embodiment, respectively.
Figure 7B:
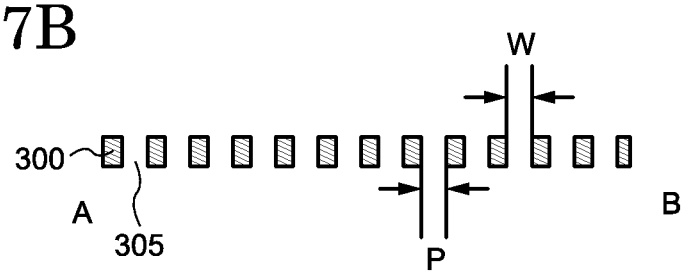

A shape of the through holes 305 is not limited to a circular shape and may be an ellipse shape, a polygonal shape, and the like. For example, as shown in FIG. 6A, the through holes 305 may have a polygonal shape such as a square. In this case, as shown in FIG. 5B, the maximum width W of the through holes 305 is also 0.1 μm to 3 μm or preferably 1 μm to 3 μm, and the pitch P is also 0.2 μm to 6 μm or preferably 2 μm to 6 μm (FIG. 6B). As is shown in FIG. 7A, when the through holes 305 have a polygonal shape, it is not necessary that their sides be parallel to a side of the mask 300. In FIG. 7A, diamond-shaped through holes 305 are formed in the mask 300. In this case, the maximum width W of the through holes 305 is also 0.1 μm to 3 μm or preferably 1 μm to 3 μm, and the pitch P is also 0.2 μm to 6 μm or preferably 2 μm to 6 μm (FIG. 7B). Moreover, it is not necessary that all of the through holes 305 have the same shape in one mask 300, and at least one of the plurality of through holes 305 may be different in shape from the other through holes 305.

Figure 8A:
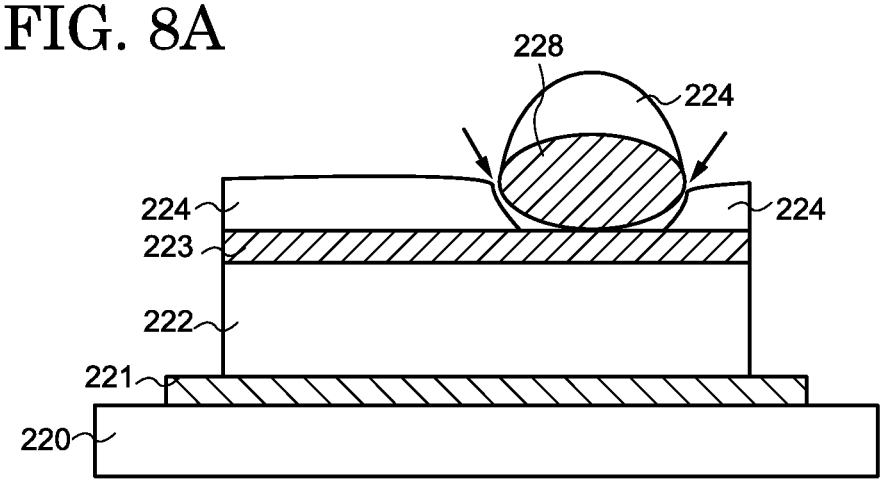
FIG. 8A and FIG. 8B are each a schematic view showing a manufacturing method of a display device according to an embodiment.

When a conductive oxide such as IZO is used as the target 150, a relatively large cluster of a target material may be sputtered from the target 150 and deposited over the substrate 220 or the organic layer 222. A schematic view of such a situation is shown in FIG. 8A. In this figure, a state is illustrated where a relatively large cluster 228 of a target material is deposited when the second electrode 223 is formed over the organic layer 222. As shown here, the presence of the cluster 228 inhibits a protection film 224 (described below) from completely covering the cluster 228 and the second electrode 223, resulting in the formation of a space indicated by an arrow. Impurities such as water and oxygen enter this space, and the second electrode 223 is corroded, which inhibits light emission in this region. As a result, this light-emitting element is recognized as a dark spot (DS) in the display device. The cluster 228 and the second electrode 223 can be completely covered by increasing the thickness of the protection film 224. In this case, however, the light emission from the light-emitting element cannot be efficiently extracted because a light absorption of the protection film 224 is increased. Hence, the thickness of the protection film 224 is limited, and it is substantially impossible to completely cover the second electrode 223 and the cluster 228 with the protection film 224 if a maximum diameter of the cluster 228 is 3 μm or more.

Figure 8B:
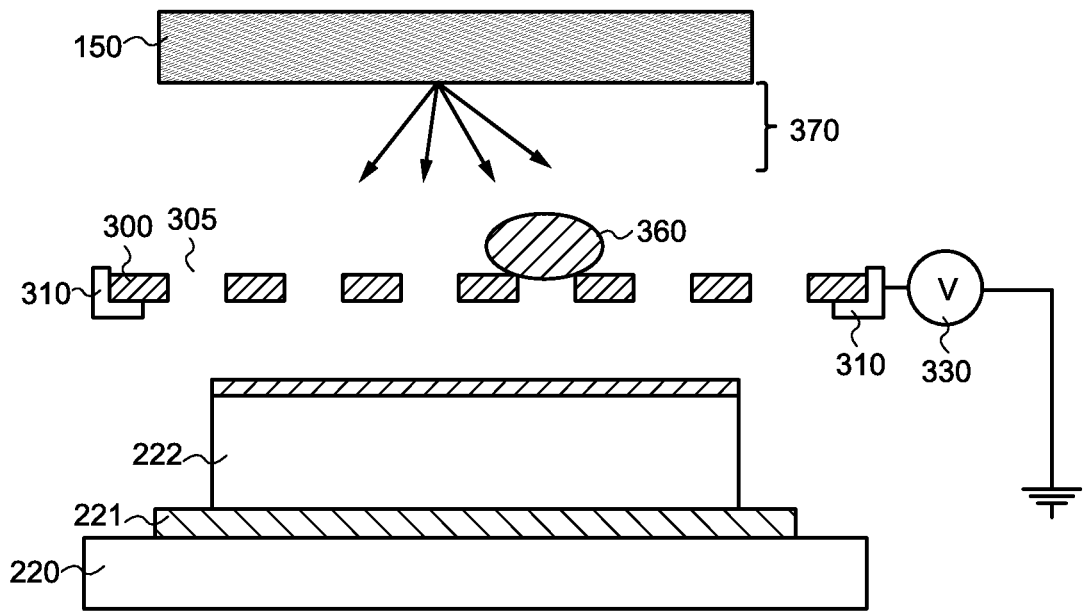

In contrast, as shown in FIG. 8B, the cluster 228 larger than the through holes 305 is blocked by the mask 300 and trapped on the mask 300 as an adhered object 360 by disposing the mask 300 when the first electrode 221 or the second electrode 223 is formed. Accordingly, the cluster 228 shown in FIG. 8A is not deposited over the substrate 220 and the organic layer 222. Therefore, a display defect such as the DS formation can be effectively suppressed, and a manufacturing yield of a display device can be improved. The mask 300 can be used when the first electrode 221 is formed over the substrate 220 with a sputtering method, by which a short circuit between the first electrode 221 and the second electrode 223 caused by the cluster 228 can be prevented.

The position of the mask 300 is adjusted with the alignment mechanism 320 and the like so that the mask 300 is located closer to the substrate 220 than to the target 150. The adjustment prevents an abnormal discharge caused by interference of the mask 300 in a discharge area 370 (see FIG. 8B) formed at a vicinity of the target 150. As described above, the distance between the mask 300 and the substrate 220 is adjusted to be 0.5 mm to 20 mm or preferably 1 mm to 10 mm.

When the first electrode 221 and the second electrode 223 are formed, the cluster of the target material sputtered from the target 150 is attached on the surface of the mask 300 as the adhered object 360. Furthermore, the target material which can pass through the through holes 305 is also deposited on the mask 300 when collided with the mask 300. The adhered object 360 and deposit can be removed by applying a direct voltage or an alternative voltage from the power source 330 on the mask 300 directly or indirectly through the mask holder 310 (see, FIG. 8B). In particular, the adhered object 360 which is ionized can be readily removed. The removal of the adhered object 360 and the deposit may be performed at regular intervals.

Figure 3A:
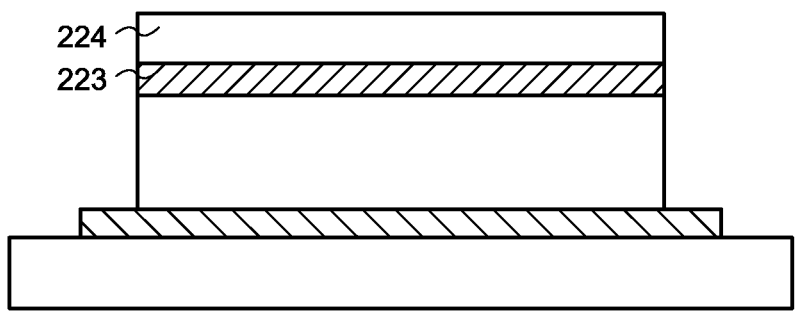
FIG. 3A and FIG. 3B are each a schematic view showing a manufacturing method of a display device according to an embodiment.

After forming the second electrode 223, the protection film 224 is formed (FIG. 3A). The protection film 224 may be formed as an inorganic insulating film including silicon nitride, silicon oxynitride, silicon oxide nitride, and the like in a single layer or a stacked layer structure. The thickness of the protection layer 224 is selected from the thickness which prevents impurities such as water and oxygen from entering the light-emitting element including the second electrode 223 and which allows the light emission from the organic layer 222 to sufficiently pass therethrough. The thickness is preferably 0.1 μm to 5 μm and more preferably 0.5 μm to 2 μm. The protection film 224 can be formed by utilizing a chemical vapor deposition (CVD) method.

Figure 3B:
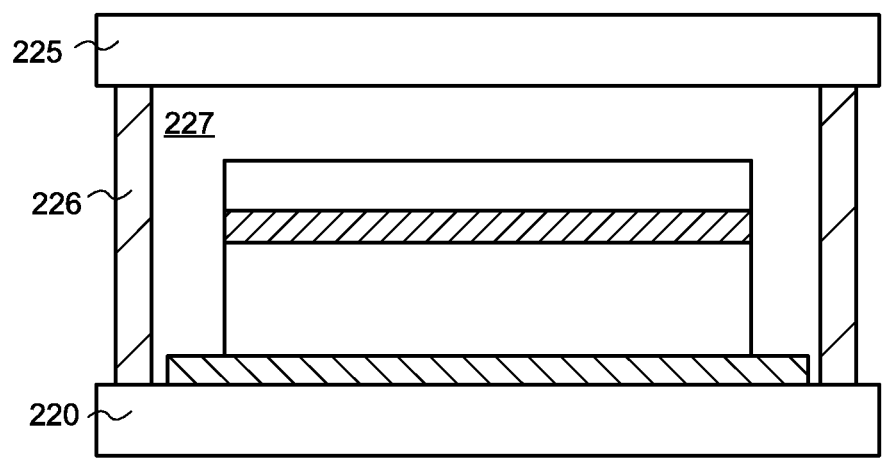

Next, an opposing substrate 225 is adhered to the substrate 220 with an adhesive to seal the light-emitting element (FIG. 3B). As the opposing substrate 225, a substrate which is the same as or similar to the substrate 220 can be used. As the adhesive 226, a thermosetting resin or a photo-curable resin such as an epoxy-based adhesive can be used. At this time, a space 227 surrounded by the substrate 220, the opposing substrate 225, and the adhesive 226 may be filled with an inert gas. Alternatively, the space 227 may be filled with an epoxy resin, a siloxane resin, and the like. A desiccant may be mixed in these resins. Through the aforementioned process, the light-emitting element is manufactured.

As described above, in the present embodiment, the mask 300 having periodically arranged through holes 305 is disposed between the substrate 220 and the target 150. Moreover, the maximum width W of the through holes 305 is preferably adjusted to 0.1 μm to 3 μm or 1 μm to 3 μm, and the pitch P is preferably adjusted to 0.2 μm to 6 μm or 2 μm to 6 μm. This structure allows the mask 300 to trap the cluster 228 of the target material with a size of approximately 3 μm or more and prevents a large foreign object from being deposited over the substrate 220. Hence, the light-emitting element can be protected even if the thickness of the protection film 224 is not increased, and it is possible to not only suppress the generation of a display defect but also contribute to the improvement in reliability and productivity of a display device.

Note that, in the present embodiment, an example is shown in which a method is implemented in a sputtering apparatus, where the method includes solidification and sequential deposition of an object to be deposited in a gas state on a substrate surface and prevents a foreign object from entering the deposit. However, the present invention is not limited thereto, and the method can be realized in another film-formation apparatus. For example, the present invention can be embodied in a vacuum evaporation apparatus, an electron-beam evaporation apparatus, a laser ablation apparatus, and a CVD apparatus, for example.

Second Embodiment

In the present invention, a display device manufactured by applying the First Embodiment is explained. As described above, the manufacturing method of a display device shown in the First Embodiment is able to prevent the deposition of a large cluster 228 of the target material sputtered from the target 150, and the use of this method allows the formation of periodically arranged projections on a surface of a resulting electrode.

Figure 9:
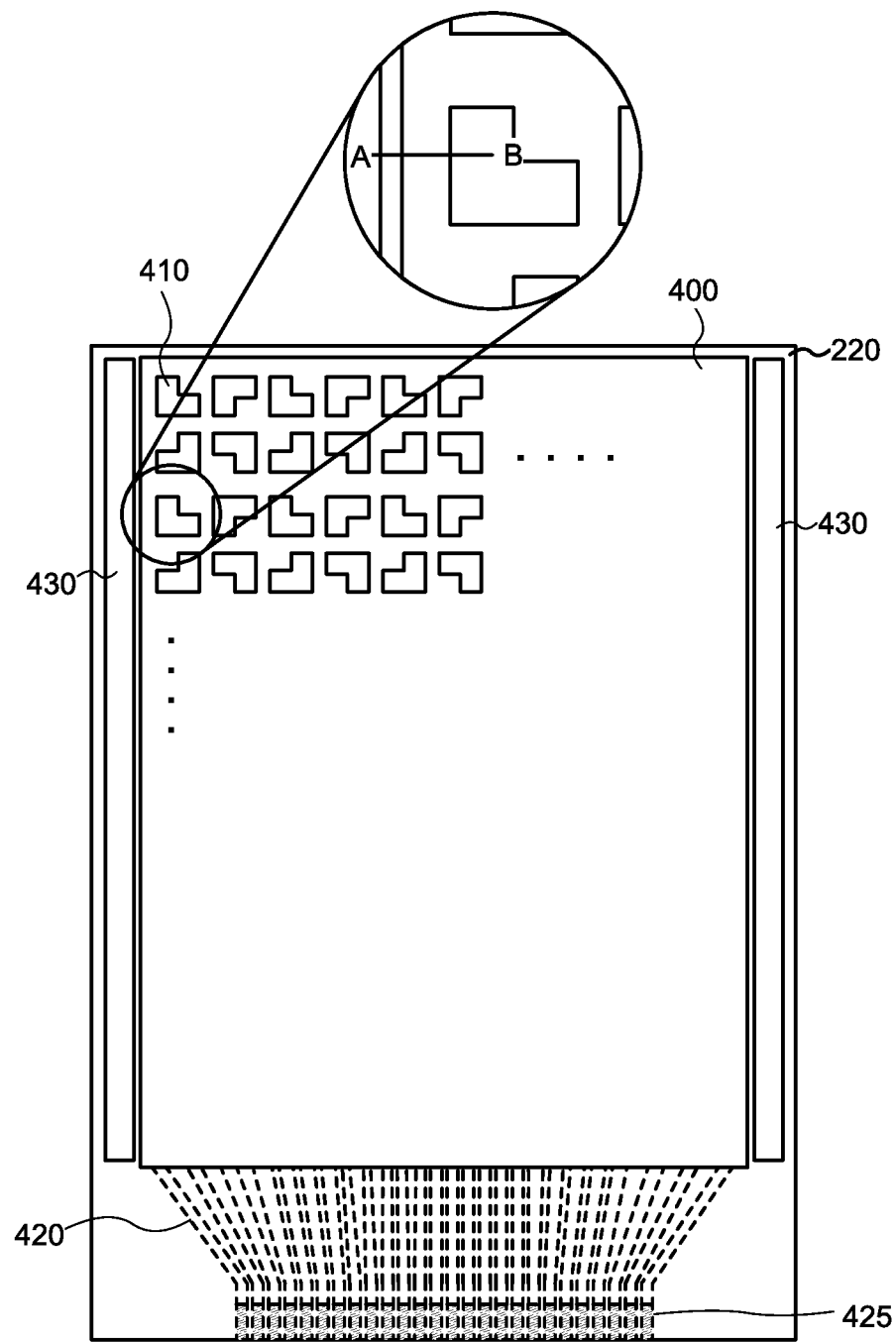
FIG. 9 is a schematic top view of a display device according to an embodiment.

A schematic top view of the display device according to the present embodiment is shown in FIG. 9. The display device has a display region 400 over a substrate 220, a plurality of wirings 420 electrically connected to the display region 400, and terminals 425 for connecting the wirings 420 to a connector (not shown) such as an FPC (Flexible Printed Circuit). A driver circuit 430 is formed at a periphery of the display region 400. An IC (Integrated Circuit) chip may be mounted at a periphery of the display region 400 or over the connector without forming the driver circuit 430.

A plurality of sub-pixels 410 is arranged in a matrix form in the display region 400. Although each of the sub-pixels 410 has a hook shape in FIG. 9, it may have another shape. For example, each sub-pixel 410 may have a rectangular or a circular shape. A schematic cross-sectional view along straight line A-B in the enlarged figure (region surrounded by a circle in FIG. 9) of the sub-pixel 410 is shown in FIG. 10.

Figure 10:
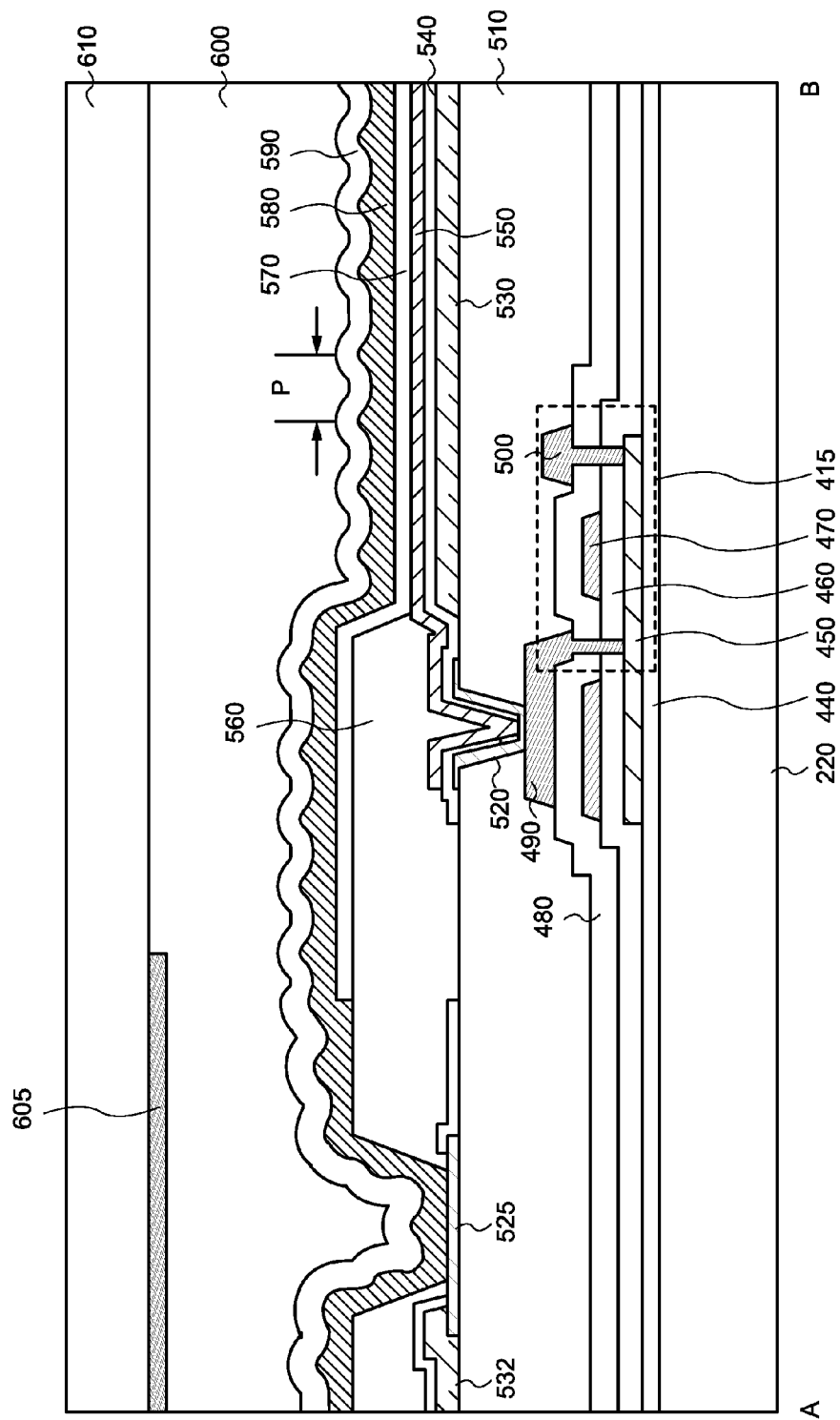
FIG. 10 is a schematic cross-sectional view of a display device according to an embodiment.

As shown in FIG. 10, the display device possesses a transistor 415 over a substrate 220 with a base film 440 interposed therebetween. The base film 440 has a function to prevent diffusion of impurities such as a metal ion released from the substrate 220 and may have a single layer structure and a stacked structure. The base film 440 is an inorganic insulating film including silicon oxide, silicon nitride, silicon nitride oxide, silicon oxynitride, and the like and can be formed by a CVD method and the like.

The transistor 415 has a function to control driving of the light-emitting element and may be a N-channel type and a P-channel type. Although only one transistor 415 is illustrated in FIG. 10, each sub-pixel 410 may include a plurality of transistors. The transistor 415 has, over the base film 440, a semiconductor film 450, a gate insulating film 460, a gate electrode 470, a protection film 480, a drain electrode 490, and a source electrode 500 in this order. Explanation is given for the case where the transistor 415 takes a top-gate structure in the present embodiment. However, the transistor 415 may be a bottom-gate type. Alternatively, both of the bottom-gate type and the top-gate type may be included.

Silicon, an oxide semiconductor, and the like can be used for the semiconductor film 450. The crystallinity thereof may be amorphous, micro-crystalline, polycrystalline, and single crystalline. The gate insulating film 460 and the protection film 480 can be formed in a single layer or stacked structure by using a material usable in the base film 440.

A metal such as aluminum, copper, molybdenum, tantalum, tungsten, and titanium or an alloy thereof can be used for the gate electrode 470, the drain electrode 490, and the source electrode 500. These electrodes may also have a single layer structure or a stacked layer structure. When these electrodes have a stacked structure, a structure may be employed in which highly conductive aluminum or copper is sandwiched between layers of molybdenum, tungsten, titanium, and the like. Note that, although not shown, a part of a metal layer giving the drain electrode 490 and the source electrode 500 is extended to an edge portion of the substrate 220 to form the terminals connected to an FPC and an IC chip.

An interlayer insulating film 510 is disposed over the transistor 415. The interlayer insulating film 510 has a function to absorb depressions and projections caused by the transistor 415 and provide a flat surface. A polymer material exemplified by a polyimide, a polysiloxane, an acrylic resin, and the like can be used for the interlayer insulating film 510

A connection electrode 520, a wiring 525, a wiring 530, a wiring 532, a dielectric film 540, and a first electrode 550 are arranged over the interlayer insulating film 510. The connection electrode 520 and the wiring 525 are formed from the same layer and can be formed by using a metal or a conductive oxide with a light-transmitting property, such as IZO and ITO. The connection electrode 520 has a function to electrically connect the drain electrode 490 to the first electrode 550. The wiring 525 forms a power source line in association with the wiring 525 and is connected to the second electrode 580 described below. The wiring 530 and the wiring 532 can be formed with a metal usable in the gate electrode 470, the drain electrode 490, and the source electrode 500. As the dielectric film 540, a silicon nitride film can be used, for example. The first electrode 550 may have a structure which is the same as that of the first electrode 221 of the First Embodiment.

The first electrode 550 is electrically connected to the drain electrode 490 through the connection electrode 520 in a contact hole formed in the interlayer insulating film 510. A capacitor is formed by the wiring 530, the dielectric film 540, and the first electrode 550.

A partition wall 560 is formed so as to cover edge portions of the first electrode 550 and the wiring 525 and to cover a depression caused by the contact hole. The partition wall 560 has a function to protect the edge portions of the first electrode 550 and the wiring 525, absorb unevenness caused by the contact hole, and electrically separate the sub-pixel 410 from an adjacent sub-pixel. The partition wall 560 can be formed with a material which is the same as that of the interlayer insulating film 510. The display device further possesses an organic layer 570 over the first electrode 550 and the partition wall 560 and has the second electrode 580 over the organic layer 570. The light-emitting element is formed by the first electrode 550, the organic layer 570, and the second electrode 580. The organic layer 570 and the second electrode 580 can have the structures which are the same as those of the organic layer 222 and the second electrode 223 of the First Embodiment, respectively.

Figure 11:
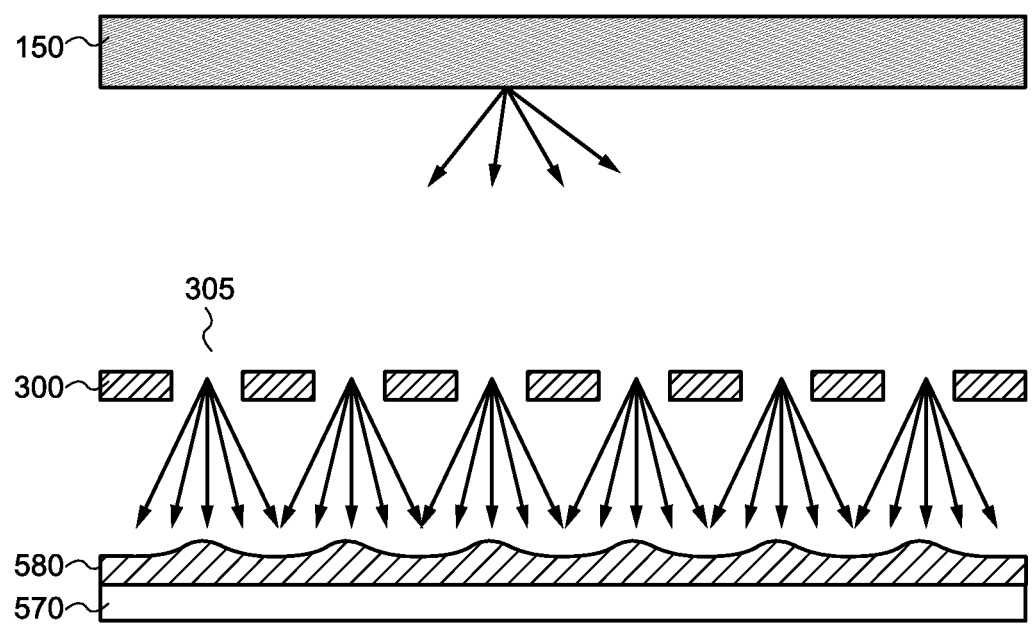
FIG. 11 is a schematic view showing a manufacturing method of a display device according to an embodiment.

Here, the second electrode 580 can be formed with a sputtering method by using the mask 300 described in the First Embodiment. The second electrode 580 is formed so as to cover the organic layer 570 and to be electrically connected to the wiring 525 functioning as the power source line. The maximum width of the through holes 305 of the mask 300 is smaller than the emission region, that is, a region where the first electrode 550 is in contact with the organic layer 570, and is also smaller than the second electrode 580. Furthermore, the pitch of the through holes 305 is extremely small compared with that of the sub-pixels 410. Therefore, the plurality of through holes 305 overlaps with the second electrode 580 in one sub-pixel 410. In this case, as shown in FIG. 11, the target material sputtered from the target 150 is diffracted when passing through the through holes 305, leading to the formation of a plurality of projections on a top surface of the second electrode 580. The projections correspond to the position of the through holes 305. Additionally, a cross section of the projections is expressed by a curve and does not contain a straight structure. Hence, their pitch (pitch P shown in FIG. 10) is the same as that of the through holes 305 and is 0.2 μm to 6 μm or 2 μm to 6 μm. Moreover, the pitch P is extremely small compared with the size of the sub-pixels 410.

A protection film 590 is provided over the second electrode 580. The protection film 590 periodically has projections having the pitch P reflecting the structure of the top surface of the second electrode 580. An inorganic compound such as silicon nitride, silicon oxide, silicon nitride oxide, and silicon oxynitride or an organic material such as an acrylic resin can be used for the protection film 590. Alternatively, these inorganic compound and organic compound may be stacked. For example, a structure may be used in which a layer of an acrylic resin is sandwiched between layers including an inorganic compound such as silicon nitride and silicon oxide.

An opposing substrate 610 is adhered over the protection film 590 with a sealing material 600 interposed therebetween (FIG. 10). A light-shielding film 605 may be provided in a region overlapping with the wire 525. Note that the sealing material 600 and the opposing substrate 610 may not be disposed.

As described above, the application of the manufacturing method of a display device according to the embodiments of the present invention allows the formation of the periodically arranged projections on the top surfaces of the second electrode 580 and the protection film 590 over the second electrode 580, for example. The pitch of the projections significantly larger than the wavelength of visible light does not cause any optically adverse influence. In other words, the out-coupling efficiency, emission efficiency, view-angle dependence and the like of the light-emitting element are not influenced, and no influence is exerted on the reflection of light from outside. Additionally, it is possible to increase an area where the second electrode 580 contacts with the sealing material 600 via the protection film 590, by which adhesion between the protection film 590 and the sealing material 600 can be improved. Hence, the probability that impurities such as water and oxygen enter the light-emitting element can be reduced without causing any optically adverse influence, which enables the production of a highly reliable display device.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A method for manufacturing a display device, the method comprising:
   forming a first electrode over a substrate;
   forming an organic layer over the first electrode, the organic layer including an emission layer; and
   forming a second electrode over the organic layer by sputtering a target including a conductive oxide with a light-transmitting property,
   wherein a mask is arranged between the organic layer and the target when the second electrode is formed,
   wherein the mask comprises a plurality of periodically arranged through holes having a maximum width equal to or larger than 0.1 μm and equal to or smaller than 3 μm, and
   wherein the mask is located closer to the substrate than to the target.

2. The method according to claim 1,
wherein a pitch of the plurality of through holes is equal to or larger than 0.2 µm and equal to or smaller than 6 µm.

3. The method according to claim 1,
wherein the mask comprises a metal.

4. The method according to claim 1, further comprising:
forming, over the second electrode, a protection film with a thickness equal to or larger than 0.1 µm and equal to or smaller than 5 µm.

5. The method according to claim 1, further comprising:
applying a direct voltage or an alternating voltage on the mask after forming the second electrode.

6. The method according to claim 1,
wherein the plurality of through holes has a circular shape.

7. The method according to claim 1,
wherein the plurality of through holes is arranged in a honeycomb pattern or a matrix pattern.

8. A method for manufacturing a display device, the method comprising:
forming a first electrode over a substrate;
forming an organic layer over the first electrode, the organic layer including an emission layer;
disposing a mask over the organic layer, the mask comprising a plurality of periodically arranged through holes; and
forming a second electrode over the organic layer by sputtering a target including a conductive oxide with a light-transmitting property,
wherein a maximum area of the plurality of through holes is smaller than an area where the organic layer and the first electrode contact with each other.

9. The method according to claim 8,
wherein a pitch of the plurality of through holes is equal to or larger than 0.2 µm and equal to or smaller than 6 µm.

10. The method according to claim 8,
wherein the mask comprises a metal.

11. The method according to claim 8, further comprising:
forming, over the second electrode, a protection film with a thickness equal to or larger than 0.1 µm and equal to or smaller than 5 µm.

12. The method according to claim 8, further comprising:
applying a direct voltage or an alternating voltage on the mask after forming the second electrode.

13. The method according to claim 8,
wherein the mask is located closer to the substrate than to the target.

14. The method according to claim 8,
wherein the plurality of through holes has a circular shape.

15. The method according to claim 8,
wherein the plurality of through holes is arranged in a honeycomb pattern or a matrix pattern.

16. A film-forming apparatus comprising:
a chamber;
a holder in the chamber, the holder being configured to hold a target;
a stage in the chamber and under the holder, the stage being configured to support a substrate;
a power source configured to induce an electric discharge in the chamber;
a gas-supplying portion configured to supply a gas to the chamber;
a mask holder configured to hold a mask having a plurality of periodically arranged through holes, the mask being arranged between the substrate and the target; and
a second power source configured to apply a direct voltage or an alternating voltage on the mask.

17. The film-forming apparatus according to claim 16, further comprising:
an alignment mechanism configured to adjust a position of the mask with respect to the substrate.

18. The film-forming apparatus according to claim 17,
wherein the substrate comprises a plurality of sub-pixels, and
wherein the alignment mechanism is configured to adjust the position of the mask so that the plurality of through holes overlaps with one of the plurality of sub-pixels.

* * * * *